(12) United States Patent
Nishioka et al.

(10) Patent No.: US 9,281,477 B2
(45) Date of Patent: Mar. 8, 2016

(54) RESISTANCE CHANGE ELEMENT AND METHOD FOR PRODUCING THE SAME

(75) Inventors: Yutaka Nishioka, Shizuoka (JP); Kazumasa Horita, Shizuoka (JP); Natsuki Fukuda, Shizuoka (JP); Shin Kikuchi, Shizuoka (JP); Koukou Suu, Shizuoka (JP)

(73) Assignee: ULVAC, INC., Kanagawa (JP)

( * ) Notice: Subject to any disclaimer, the term of this patent is extended or adjusted under 35 U.S.C. 154(b) by 5 days.

(21) Appl. No.: 14/125,254

(22) PCT Filed: Jun. 17, 2012

(86) PCT No.: PCT/JP2012/003728
§ 371 (c)(1),
(2), (4) Date: Mar. 5, 2014

(87) PCT Pub. No.: WO2012/169195
PCT Pub. Date: Dec. 13, 2012

(65) Prior Publication Data
US 2014/0166966 A1    Jun. 19, 2014

(30) Foreign Application Priority Data

Jun. 10, 2011  (JP) ................. 2011-130011

(51) Int. Cl.
*H01L 45/00* (2006.01)
*G11C 11/56* (2006.01)
*G11C 13/00* (2006.01)

(52) U.S. Cl.
CPC ........ *H01L 45/1253* (2013.01); *G11C 11/5614* (2013.01); *G11C 13/0007* (2013.01); *H01L 45/08* (2013.01); *H01L 45/1266* (2013.01); *H01L 45/146* (2013.01); *H01L 45/16* (2013.01); *H01L 45/1616* (2013.01); *H01L 45/1625* (2013.01); *H01L 45/1675* (2013.01); *G11C 2213/15* (2013.01); *G11C 2213/56* (2013.01)

(58) Field of Classification Search
CPC .................................................. H01L 45/1266
See application file for complete search history.

(56) References Cited

U.S. PATENT DOCUMENTS

2009/0283736 A1* 11/2009 Kanzawa et al. ................. 257/2
2010/0190313 A1*  7/2010 Kawashima et al. ......... 438/385
2011/0240942 A1* 10/2011 Tsuji ................................ 257/2

FOREIGN PATENT DOCUMENTS

JP    2008-060091 A    3/2008
JP    2008-300841 A   12/2008

(Continued)

OTHER PUBLICATIONS

International Search Report in International Application No. PCT/JP2012/003728, filed Jun. 7, 2012.

*Primary Examiner* — Michael Shingleton
(74) *Attorney, Agent, or Firm* — Saliwanchik, Lloyd & Eisenschenk

(57) ABSTRACT

To provide a resistance change element which does not require a forming process and enables reduction of power consumption and miniaturization of the element, and to provide a method for producing it. A resistance change element 1 according to an embodiment of the present invention includes a bottom electrode layer 3, a top electrode layer 5 and an oxide semiconductor layer 4. The oxide semiconductor layer 4 has a first metal oxide layer 41 and a second metal oxide layer 42. The first metal oxide layer 41 is formed between the bottom electrode layer 3 and the top electrode layer 5, and in ohmic contact with the bottom electrode layer 3. The second metal oxide layer 42 is formed between the first metal oxide layer 41 and the top electrode layer 5, and in ohmic contact with the top electrode layer 5.

3 Claims, 6 Drawing Sheets

(56) References Cited

FOREIGN PATENT DOCUMENTS

| JP | 2010-232229 A | | 10/2010 |
|---|---|---|---|
| WO | WO-2006/075574 A1 | | 7/2006 |
| WO | WO-2007/138646 A1 | | 12/2007 |
| WO | WO-2008/107941 A1 | | 9/2008 |
| WO | WO-2008/149484 A1 | | 12/2008 |
| WO | WO2010/067585 | * | 6/2010 |
| WO | WO-2010-073897 A1 | | 7/2010 |

* cited by examiner

000
RESISTANCE CHANGE ELEMENT AND METHOD FOR PRODUCING THE SAME

CROSS-REFERENCE TO RELATED APPLICATIONS

This application is the U.S. national stage application of International patent application No. PCT/JP 12/003728, filed Jun. 7, 2012, which claims priority to Japanese Application No. 2011-130011, filed Jun. 10, 2011, the disclosures of each of which are incorporated herein by reference in their entirety.

TECHNICAL FIELD

The present invention relates to a resistance change element that is used as non-volatile memory, for example, and relates to a method for producing the resistance change element.

BACKGROUND ART

Semiconductor memories include volatile memories such as DRAM (Dynamic Random Access Memory) and non-volatile memories such as flash memories. While known non-volatile memories include NAND flash memories and the like, ReRAM (Resistance Random Access Memory) is drawing attention as a device which is capable of being more miniaturized.

ReRAM uses a variable resistor, which changes resistance in response to changes in the electric voltage, as a resistance element. A typical type of this variable resistor has at least two layers of metal oxide layers which are different in the degree of oxidation or the resistivity, and has a structure in which these layers are sandwiched between top and bottom electrodes. For example, in the following Patent Document 1, there is described a resistance element that has a bottom electrode (Pt), and a titanium oxide film, a nickel oxide film and a top electrode (Pt) laminated thereon in the order.

Patent Document 1: International Publication No. WO 2008/107941

DISCLOSURE OF THE INVENTION

Problem to be Solved by the Invention

Variable resistance elements in the past have needed to go through an initialization process which involves a high-voltage application called forming. After the forming, a path for electrical conduction called filament is formed at the oxide layer to realize a lower resistance of the element. However, since size and position of the filament may not be controlled properly, the operation current would not be able to be reduced. Further, there would be a large variation in the characteristics in the plane. Consequently, there has been a problem that reduction of power consumption and miniaturization of the element have been difficult.

In view of the circumstances as described above, an object of the present invention is to provide a resistance change element which does not require a forming process and enables reduction of power consumption and miniaturization of the element, and to provide a method for producing it.

Means for Solving the Problem

In order to solve the problems described above, a resistance change element according to an embodiment of the present invention includes a first electrode, a second electrode, and an oxide semiconductor.

The oxide semiconductor has a first metal oxide layer and a second metal oxide layer. The first metal oxide layer is formed between the first electrode and the second electrode. The first metal oxide layer is in ohmic contact with the first electrode. The second metal oxide layer is formed between the first metal oxide layer and the second electrode. The second metal oxide layer is in ohmic contact with the second electrode.

A method according to an embodiment of the present invention for producing a resistance change element includes forming, on a substrate, a first electrode made of any metal selected from Ti, V, Cr, Zr, Nb, Mo, Hf, Ta and W, or a compound thereof.

On the first electrode, a first metal oxide layer is formed. The first metal oxide layer has a first resistivity and is made of an N-type oxide semiconductor.

On the first metal oxide layer, a second metal oxide layer is formed. The second metal oxide layer has a second resistivity different from the first resistivity, and is made of an N-type oxide semiconductor.

On the second metal oxide layer, a second electrode made of any metal selected from Ti, V, Cr, Zr, Nb, Mo, Hf, Ta and W, or a compound thereof is formed.

A method according to another embodiment of the present invention for producing a resistance change element includes forming, on a substrate, a first electrode made of any metal selected from Fe, Co, Ni, Cu, Ru, Rh, Pd, Ag, Os, Ir, Pt and Au, or a compound thereof.

On the first electrode, a first metal oxide layer is formed. The first metal oxide layer has a first resistivity and is made of a P-type oxide semiconductor.

On the first metal oxide layer, a second metal oxide layer is formed. The second metal oxide layer has a second resistivity different from the first resistivity, and is made of a P-type oxide semiconductor.

On the second metal oxide layer, a second electrode made of any metal selected from Fe, Co, Ni, Cu, Ru, Rh, Pd, Ag, Os, Ir, Pt and Au, or a compound thereof is formed.

MODE(S) FOR CARRYING OUT THE INVENTION

Figure 1:
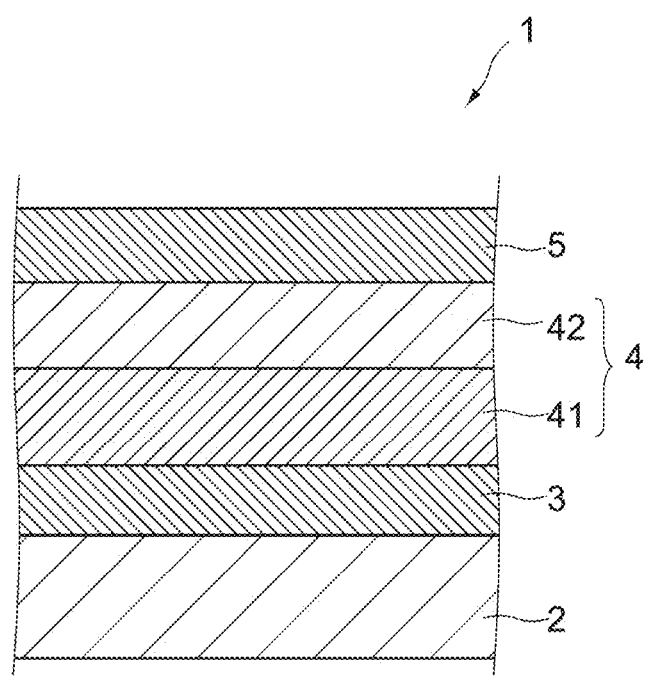
[FIG. 1] A schematic sectional view showing a structure of a resistance change element according to an embodiment of the present invention.

A resistance change element according to an embodiment of the present invention includes a first electrode, a second electrode, and an oxide semiconductor.

The oxide semiconductor has a first metal oxide layer and a second metal oxide layer. The first metal oxide layer is formed between the first electrode and the second electrode. The first metal oxide layer is in ohmic contact with the first electrode. The second metal oxide layer is formed between the first metal oxide layer and the second electrode. The second metal oxide layer is in ohmic contact with the second electrode.

In the resistance change element, the oxide semiconductor is in ohmic contact with each of the first electrode and the second electrode. This configuration makes both of the interfaces between the first electrode and the oxide semiconductor and between the oxide semiconductor and the second electrode show no rectifying properties. This allows the oxygen ions in the oxide semiconductor to be driven at relatively low voltage. This eliminates the need of the forming process which involves a high-voltage application. It thus makes it possible to achieve reduction of power consumption and miniaturization of the element.

To realize ohmic contact, the constituent materials of the first and the second electrodes are selected depending on types of carriers of the first and the second metal oxide layers that make up the oxide semiconductor.

For example, when the first and the second metal oxide layers are an N-type oxide semiconductor, the first and the second electrodes are made using any metal selected from Ti, V, Cr, Zr, Nb, Mo, Hf, Ta and W, or a compound thereof. On the other hand, when the first and the second metal oxide layers are a P-type oxide semiconductor, the first and the second electrodes are made using any metal selected from Fe, Co, Ni, Cu, Ru, Rh, Pd, Ag, Os, Ir, Pt and Au, or a compound thereof. In either case, the first and the second electrodes may be made of the same material or may be made of different materials.

For example, when the first and the second metal oxide layers are an N-type oxide semiconductor, the first and the second electrodes are made using any metal selected from Ti, V, Cr, Zr, Nb, Mo, Hf. Ta and W, or a compound thereof. On the other hand, when the first and the second metal oxide layers are a P-type oxide semiconductor, the first and the second electrodes are made using any metal selected from Fe, Co, Ni, Cu, Ru, Rh, Pd, Ag, Os, Ir, Pt and Au, or a compound thereof. In either case, the first and the second electrodes may be made of the same material or may be made of different materials.

Herein, an N-type oxide semiconductor means an oxide semiconductor in which the dominant carriers are electrons. A P-type oxide semiconductor means an oxide semiconductor in which the dominant carriers are holes.

A method according to an embodiment of the present invention for producing a resistance change element includes forming, on a substrate, a first electrode made of any metal selected from Ti, V, Cr, Zr, Nb, Mo, Hf, Ta and W, or a compound thereof.

On the first electrode, a first metal oxide layer is formed. The first metal oxide layer has a first resistivity and is made of an N-type oxide semiconductor.

On the first metal oxide layer, a second metal oxide layer is formed. The second metal oxide layer has a second resistivity different from the first resistivity, and is made of an N-type oxide semiconductor.

On the second metal oxide layer, a second electrode made of any metal selected from Ti, V, Cr, Zr, Nb, Mo, Hf, Ta and W, or a compound thereof is formed.

A method according to another embodiment of the present invention for producing a resistance change element includes forming, on a substrate, a first electrode made of any metal selected from Fe, Co, Ni, Cu, Ru, Rh, Pd, Ag, Os, Ir, Pt and Au, or a compound thereof.

On the first electrode, a first metal oxide layer is formed. The first metal oxide layer has a first resistivity and is made of a P-type oxide semiconductor.

On the first metal oxide layer, a second metal oxide layer is formed. The second metal oxide layer has a second resistivity different from the first resistivity, and is made of a P-type oxide semiconductor.

On the second metal oxide layer, a second electrode made of any metal selected from Fe, Co, Ni, Cu, Ru, Rh, Pd, Ag, Os, Ir, Pt and Au, or a compound thereof is formed.

This production method allows ohmic contact between the first electrode and the oxide semiconductor and between the oxide semiconductor and the second electrode. Therefore, both of the interfaces between the first electrode and the oxide semiconductor and between the oxide semiconductor and the second electrode show no rectifying properties. This allows the oxygen ions in the oxide semiconductor to be driven at relatively low voltage. This eliminates the need of the forming process which involves a high-voltage application. It thus makes it possible to achieve reduction of power consumption and miniaturization of the element.

Hereinafter, with reference to the drawings, an embodiment of the present invention will be described.

FIG. 1 is a schematic sectional view showing a structure of a resistance change element according to an embodiment of the present invention. A resistance change element 1 of this embodiment has a substrate 2, a bottom electrode layer 3, an oxide semiconductor layer 4 and a top electrode layer 5.

The oxide semiconductor layer 4 has a first metal oxide layer 41 and a second metal oxide layer 42. The first metal oxide layer 41 and the second metal oxide layer 42 are made of the same material and otherwise they may be made of different materials from each other. One of the first metal oxide layer 41 and the second metal oxide layer 42 is made of the oxide material having near-stoichiometric composition (hereinafter also referred to as "stoichiometric composition material") and another is made of the oxide material containing a large number of oxygen vacancies (hereinafter also referred to as "oxygen vacancy material"). In this embodiment, the first metal oxide layer 41 is made of a stoichiometric composition material and the second metal oxide layer 42 is made of an oxygen vacancy material.

As the first metal oxide layer 41 of the resistance change element 1 has a higher degree of oxidation than that of the second metal oxide layer 42, it has a higher resistivity than the second metal oxide layer 42. In this case, when a positive voltage and a negative voltage are respectively applied to the top electrode layer 5 and the bottom electrode layer 3, the oxygen ions ($O_2^-$) in the first metal oxide layer 41 which has a high resistivity would diffuse into the second metal oxide layer 42 which has a low resistivity. The resistance of the first metal oxide layer 41 would be lowered (low-resistance state). Conversely, when the positive voltage and the negative voltage are respectively applied to the bottom electrode layer 3 and the top electrode layer 5, the oxygen ions would diffuse from the second metal oxide layer 42 into the first metal oxide layer 41. The degree of oxidation of the first metal oxide layer 41 would increase again, and the resistance thereof becomes high (high-resistance state).

As described above, the first metal oxide layer 41 switches reversibly between its low-resistance state and high-resistance state by a voltage control between the bottom electrode layer 3 and the top electrode layer 5. Moreover, the low-resistance state and the high-resistance state can be kept without the voltage kept applied. The resistance change element 1 is thus able to be used as a non-volatile memory device, as allowing writing of data at the high-resistance state and reading of data at the low-resistance state.

Resistance change elements in the past have needed to go through an initialization operation called "forming" in which a voltage higher than a switching operation voltage is applied to an oxide semiconductor layer, so as to give rise to a phenomenon similar to a dielectric breakdown. The switching operation of the oxide semiconductor layer is thought to be expressed by that an electric path called "filament" is generated at the oxide semiconductor layer by the forming. However, since size and position of the filament may not be controlled properly, the operation current would not be able to be reduced. Further, there would be a large variation in the characteristics in the plane. Consequently, there has been a problem that reduction of power consumption and miniaturization of the element have been difficult.

The need for the high-voltage in forming is thought to be due to the contact resistance being large at the interface between the electrode layer and the oxide semiconductor layer, which decreases the voltage applied to the oxide semiconductor layer. The difficulty in controlling the filament is thought to be due to the high-voltage being selectively applied to grain boundaries of the oxide semiconductor layer and to local oxygen vacancies, which results in uneven formation of the filament.

In view of this, the present inventors assumed that the need for the forming which requires a high voltage may be eliminated by realizing a lower resistance of the interface between the electrode layer and the oxide semiconductor layer. The present inventors have studied optimizing the combination between electrode materials and oxide semiconductor materials.

In this embodiment, to realize a lower resistance at the interfaces between the bottom electrode layer 3 and the oxide semiconductor layer 4 and between the top electrode layer 5 and the oxide semiconductor layer, the oxide semiconductor layer 4 is in ohmic contact with each of the bottom electrode layer 3 and the top electrode layer 5. That is, the oxide semiconductor layer 4 has a laminated structure of the first metal oxide layer 41 that is in ohmic contact with the bottom electrode layer 3 and the second metal oxide layer 42 that is in ohmic contact with the top electrode layer 5.

This configuration makes both of the interfaces between the bottom electrode layer 3 and the oxide semiconductor layer 4 and between the oxide semiconductor layer 4 and the top electrode layer 5 show no rectifying properties. This allows the oxygen ions in the oxide semiconductor layer 4 to be driven at relatively low voltage. This eliminates the need of the forming process which involves a high-voltage application. Further, this allows the operation voltage to be applied to the entire oxide semiconductor layer 4 evenly, and thus can reduce the driving current. Moreover, this may suppress uneven formation of the filament by preventing the high-voltage from being selectively applied to grain boundaries of the oxide semiconductor layer and to local oxygen vacancies, and thus can equalize the characteristics and makes it possible to miniaturize the element.

To realize ohmic contact, the constituent materials of the bottom electrode layer 3 and the top electrode layer 5 are selected depending on types of carriers of the first and the second metal oxide layers 41, 42.

For example, when the first and the second metal oxide layers 41, 42 are an N-type oxide semiconductor, the bottom electrode layer 3 and the top electrode layer 5 are made using a material having a lower work function than the first and the second metal oxide layers 41, 42. Examples of the N-type oxide semiconductors include $TaO_x$, $HfO_x$, $ZrO_x$, $TiO_x$, $SrTiO_x$ and the like. Examples of the electrode materials that can form ohmic contact with them include those selected from the metal materials such as Ti, V, Cr, Zr, Nb, Mo, Hf, and W, or a compound thereof. The compound may be a silicide, carbide, oxide, nitride, germanium compound or the like, of any metal material mentioned above.

On the other hand, when the first and the second metal oxide layers 41, 42 are a P-type oxide semiconductor, the bottom electrode layer 3 and the top electrode layer 5 are made using a material having a higher work function than the first and the second metal oxide layers 41, 42. Examples of the P-type oxide semiconductors include $CoO_x$, $NiO_x$, $Pr(Ca, Mn)O_x$ and the like. Examples of the electrode materials that can form ohmic contact with them include those selected from the metal materials such as Fe, Co, Ni, Cu, Ru, Rh, Pd, Ag, Os, Ir, Pt and Au, or a compound thereof. The compound may be a silicide, carbide, oxide, nitride, germanium compound or the like, of any metal material mentioned above.

Next, a method for producing the resistance change element 1 shown in FIG. 1 will be described.

First, the bottom electrode layer 3 is formed on the substrate 2. Typically, as the substrate 2, a semiconductor substrate such as a silicon wafer may be used, but not limited thereto as a matter of course. The bottom electrode layer 3 may be formed by various film-forming methods such as vacuum deposition, sputtering, CVD (Chemical Vapor Deposition) and ALD (Atomic Layer Deposition) methods. The bottom electrode layer 3, desirably, may be flat and having no grain boundaries. In this embodiment, metallic tantalum (Ta) is used as the bottom electrode layer 3. The thickness thereof is not particularly limited, and for example, may be 50 nm.

Next, the oxide semiconductor layer 4 is formed on the bottom electrode layer 3. First, as the first metal oxide layer 41, a metal oxide having stoichiometric composition or near-stoichiometric oxygen content is produced by vacuum deposition, sputtering, CVD method, ALD method or the like. At this time, the metal oxide that can realize ohmic contact to the bottom electrode layer 3 is selected.

In this embodiment, the first metal oxide layer 41 is made of a tantalum oxide ($TaO_x$) film which is formed by sputtering. The thickness thereof is not particularly limited, and for example, may be 5 nm. As the film-forming method, reactive sputtering where a Ta target is sputtered in an oxygen atmosphere, multiple sputtering where a Ta target and a $TaO_x$ target are sputtered together, or the like may be employed.

At this time, by preventing an insulating oxide from being interposed at the interface between the bottom electrode layer 3 and the first metal oxide layer 41, it is able to stably realize ohmic contact in the interface between the bottom electrode layer 3 and the first metal oxide layer 41. The methods not to generate an insulating oxide are given below.

(1) Form the metal oxide layer by high-frequency sputtering using a metal oxide target and an inert gas such as Ar.

(2) Multi laminate the metal oxide on an oxidation-resistant electrode such as Pt, Ir, Ru, Pd, TiN, TiAlN and TaN, by an ALD method, CVD method, reactive sputtering using an oxidizing gas, or the like.

(3) Deposit the metal oxide on an oxide conductor such as $IrO_x$, $RuO_x$, $IrO_x$, $RuO_x$, $SrRuO_3$, $LaNiO_3$ and ITO, by an ALD method, CVD method, reactive sputtering using an oxidizing gas, or the like.

(4) Deposit the metal oxide on a conductive material that contains an element of Si, C, Ge or the like having a strong reduction force, which conductive material may be TaC, WSi, WGe or the like, by an ALD method, CVD method, reactive sputtering using an oxidizing gas, or the like.

(5) Subject the neighborhood of the interface with the bottom electrode of the metal oxide, which is deposited on the bottom electrode layer 3, to ion implantation or plasma-doping of donor or acceptor elements; or mix the donor or acceptor elements into the film-forming gas or the target.

(6) Combine a metal material and an oxide material which do not form a potential barrier.

Subsequently, the second metal oxide layer 42 is formed on the first metal oxide layer 41. In this embodiment, as the second metal oxide layer 42, a tantalum oxide layer having lower oxygen content than stoichiometric composition is formed by film-forming. The thickness thereof is not particularly limited, and for example, may be 40 nm. The film-forming method is not particularly limited, and it may be produced by, for example, vacuum deposition, sputtering, CVD method, ALD method or the like.

The oxide semiconductor layer 4 is thus formed. Next, the top electrode layer 5 is formed on the oxide semiconductor layer 4. The top electrode layer 5 may be formed by various film-forming methods such as vacuum deposition, sputtering, CVD and ALD methods. In this embodiment, metallic tantalum (Ta) is used as the top electrode layer 5. The thickness thereof is not particularly limited, and for example, may be 50 nm. It can thus realize the predetermined ohmic contact between this and the oxide semiconductor layer 4.

The resistance change element 1 is formed in a predetermined element size. Patterning of each layer may be made using lithography and dry etching technique, lithography and wet etching technique, or film-forming of each layer through resist masks or the like. When the etching technique is employed, this resistance change element 1 may be built in an interlayer insulating film between a bottom wiring layer and a top wiring layer.

The resistance change element 1 of this embodiment having the configuration as described above allows ohmic contact to be formed at the interfaces between the bottom electrode layer 3 and the oxide semiconductor layer 4 and between the oxide semiconductor layer 4 and the top electrode layer 5. This realizes a lower resistance of both of the interfaces between the oxide semiconductor layer 4 and the both of the electrode layers 3, 5. This eliminates the need of the initialization operation called "forming" which has been performed in the past, and thus can reduce the cost.

Figure 2:
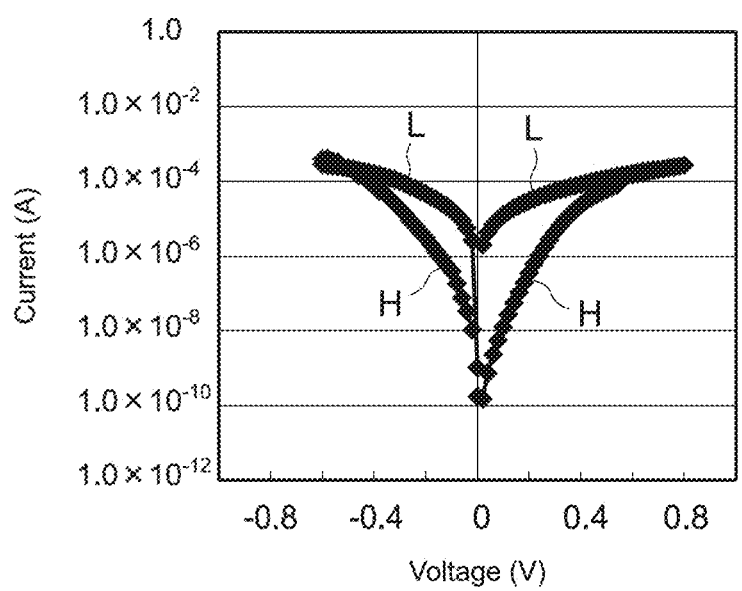
[FIG. 2] A figure showing an example of current-voltage characteristics of the resistance change element according to the embodiment of the present invention.
Figure 3:
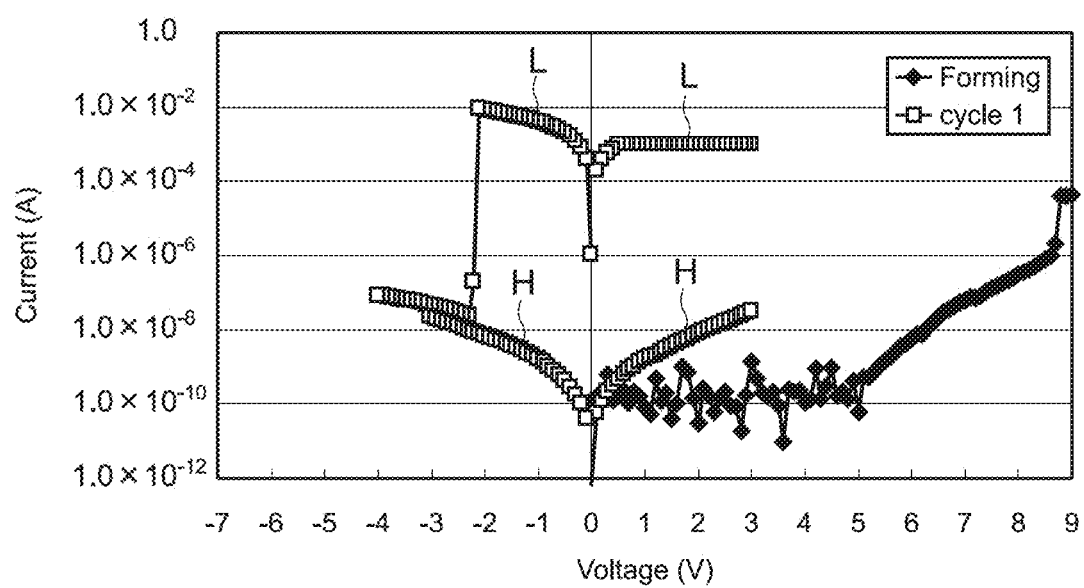
[FIG. 3] A figure showing an example of current-voltage characteristics of the resistance change element according to a comparative example.

An example of current-voltage characteristics of the resistance change element 1 of this embodiment is shown in FIG. 2. In the figure, the abscissa indicates the voltage and the ordinate indicates the current. In the figure, "H" denotes the high-resistance state and "L" denotes the low-resistance state. FIG. 3 is a result of an experiment showing current-voltage characteristics of the resistance change element according to a comparative example, which has a configuration similar to that of the resistance change element 1 according to the embodiment, except that the top electrode layer is made of Pt. In this case, Pt is a representative example of the metal material having a higher work function than an oxide semiconductor layer having N-type conductivity characteristics, and forms Schottky junction at the interface with the oxide semiconductor layer.

The resistance change element according to the comparative example would require, as shown in FIG. 3, approximately 9 V forming voltage and about 3 V switching voltage. In contrast, the resistance change element 1 according to the embodiment did not need the initialization operation, as shown in FIG. 2, and it was also capable of keeping the switching voltage as low as about 0.8 V. Moreover, the resistance change element 1 according to the embodiment, as compared to the resistance change element according to the comparative example, would be able to keep down the operation current (readout current) in the low-resistance state. Thus, the present embodiment can greatly reduce the power consumption of the element.

Besides, in the resistance change element 1 according to the embodiment, by eliminating the need of the forming, uneven formation of the filament which might have occurred at the oxide semiconductor layer 4 can be suppressed. This makes it possible to stably produce a resistance change element having uniform electrical characteristics even if the element is miniaturized. Moreover, as it can reduce the filament-dependency of the operation current, the driving current for the element is able to be controlled depending on element sizes.

Figure 4:
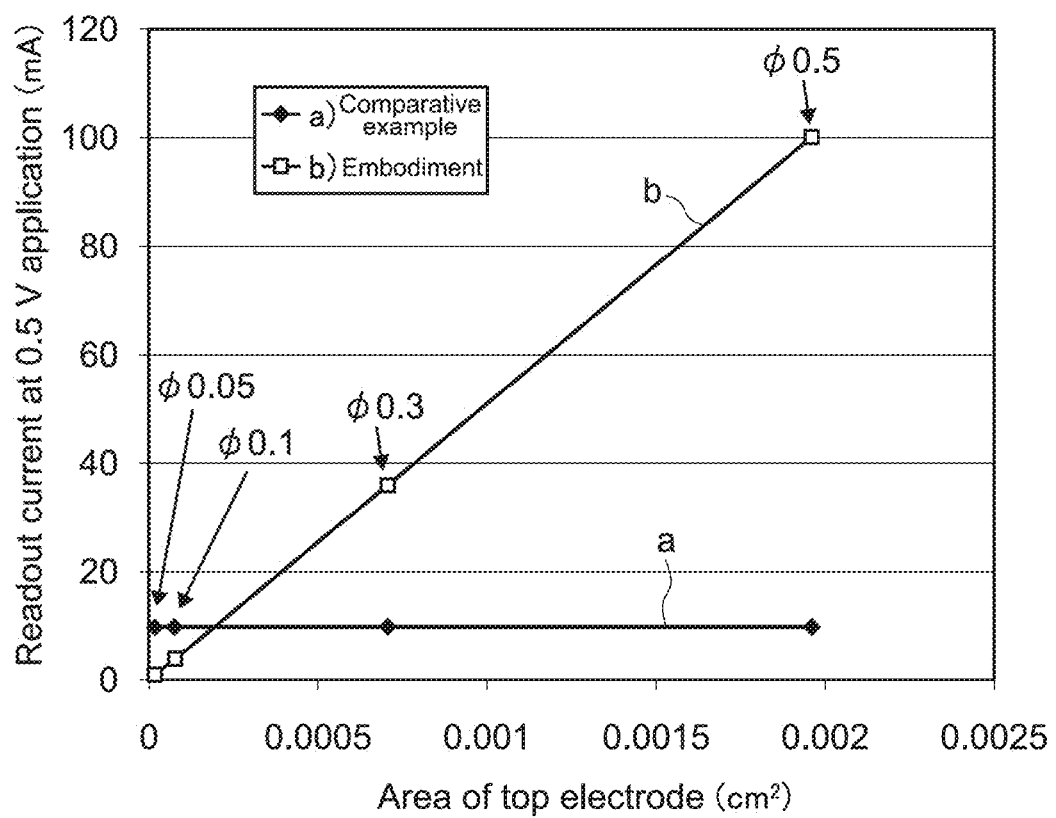
[FIG. 4] A figure showing a relationship between the top electrode and the readout current, according to the embodiment and the comparative example.

For example, FIG. 4 shows an example of the electrode-area dependency of the readout current. In the figure, the abscissa indicates the area of the top electrode and the ordinate indicates the current at a 0.5 V application. In the figure, "a" denotes the current characteristics of the resistance change element according to the comparative example and "b" denotes the current characteristics of the resistance change element according to the example. As shown in FIG. 4, the resistance change element according to the comparative example showed a substantially constant readout current irrespective of the electrode area. In contrast, the resistance change element according to the embodiment was found to be able to provide the readout current proportional to the electrode area. This revealed that driving current for the element is able to be controlled by element sizes.

Figure 5:
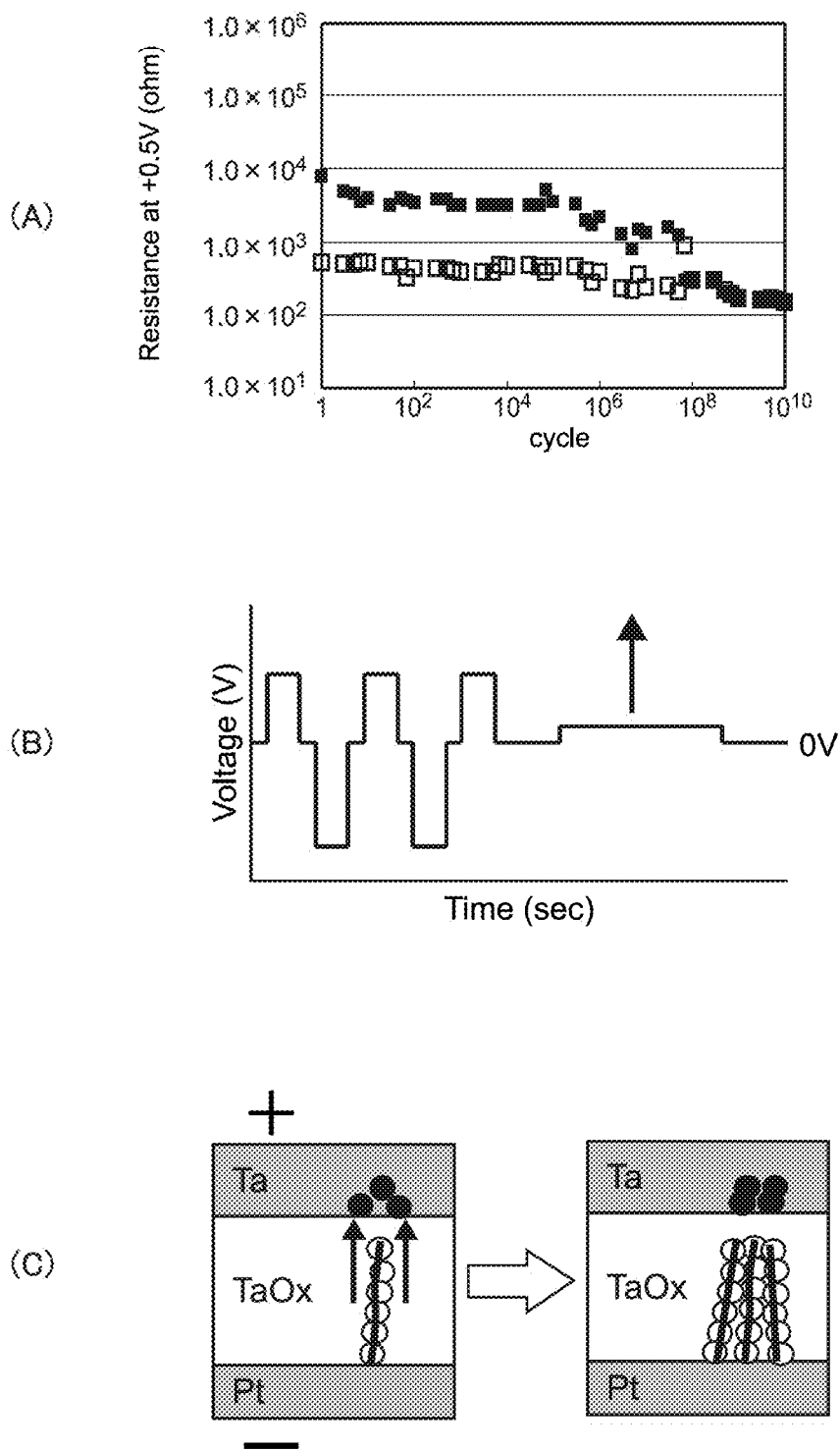
[FIG. 5] A result of an experiment where switching characteristics were evaluated when the readout voltage was a positive voltage in the resistance change element according to the comparative example; (A) showing repeated switching characteristics, (B) showing applied pulse waveform, and (C) showing a switching model of the element.
Figure 6:
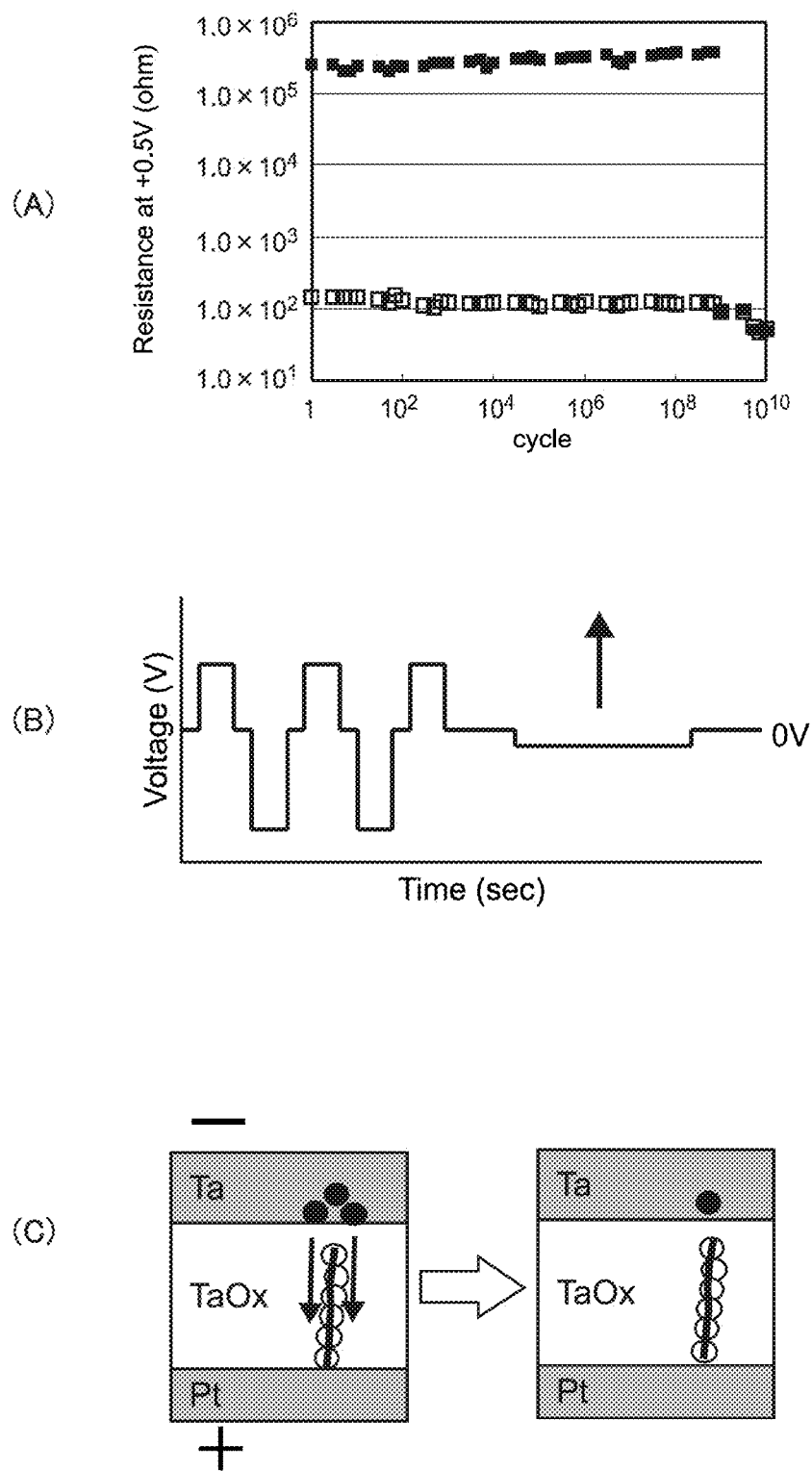
[FIG. 6] A result of an experiment where switching characteristics were evaluated when the readout voltage was a negative voltage in the resistance change element according to the comparative example; (A) showing repeated switching characteristics, (B) showing applied pulse waveform, and (C) showing a switching model of the element.

FIGS. 5 and 6 are a result of an experiment where stability of switching operation of the resistance change element according to the comparative example, FIG. 5 showing a case where the readout voltage was a positive voltage (+0.5 V), and FIG. 6 showing a case where the readout voltage was a negative voltage (−0.5 V). In each figure, (A) shows repeated switching characteristics, (B) shows applied pulse waveform, and (C) shows a switching model of the element.

When the readout voltage was positive, as shown in (A) of FIG. 5, the on/off ratio gradually changed with the increase of the switching cycles. On the other hand, when the readout voltage was negative, as shown in (A) of FIG. 6, the on/off ratio remained constant for about 10^9 cycles, which was found to show a stable switching operation. This can be assumed to be because when the readout voltage is positive, as shown in (C) of FIG. 5, a conductive path (filament) formed to the oxide semiconductor layer gradually grows thicker, and when the readout voltage is negative, as shown in (C) of FIG. 6, the thickness of the conductive path stays the same.

Hereinabove, the embodiment of the present invention has been described. The present invention is not limited thereto, but various modifications can be made based on the technical idea of the present invention.

For example, in the embodiment above, the first metal oxide layer 41 was made of stoichiometric composition material and the second metal oxide layer 42 was made of oxygen vacancy material. Alternatively, the first metal oxide layer 41 may be made of oxygen vacancy material and the second metal oxide layer 42 may be made of stoichiometric composition material.

Further, in the embodiment above, the first metal oxide layer 41 and the second metal oxide layer 42 were made of the same metal oxide. However, it is not limited thereto, and may be any combination of materials as long as the materials are in the same conductivity type (N-type or P-type). Likewise, the materials of the bottom electrode 3 and the top electrode 5 may be a combination of different materials as long as they are adapted to the conductivity type of the oxide semiconductor.

DESCRIPTION OF REFERENCE NUMERALS

1 resistance change element
2 substrate
3 bottom electrode layer
4 oxide semiconductor layer
5 top electrode layer
41 first metal oxide layer
42 second metal oxide layer

The invention claimed is:

1. A resistance change element comprising:
a first electrode;
a second electrode; and
an oxide semiconductor comprising:
a first metal oxide layer formed between the first electrode and the second electrode, the first metal oxide layer being in ohmic contact with the first electrode; and
a second metal oxide layer formed between the first metal oxide layer and the second electrode, the second metal oxide layer being in ohmic contact with the second electrode;
wherein the first metal oxide layer and the second metal oxide layer are each an N-type oxide semiconductor; and
wherein the first electrode and the second electrode are each any metal selected from V, Cr, Zr, Nb, Mo, and Hf.

2. A resistance change element comprising:
a first electrode;
a second electrode; and
an oxide semiconductor comprising:
a first metal oxide layer formed between the first electrode and the second electrode, the first metal oxide layer being in ohmic contact with the first electrode; and
a second metal oxide layer formed between the first metal oxide layer and the second electrode the second metal oxide la er bein =in ohmic contact with the second electrode;
wherein the first metal oxide layer and the second metal oxide layer are a P-type oxide semiconductor including $CoO_x$; and
wherein the first electrode and the second electrode are any metal selected from Fe, Co, Ni, Cu, Ru, Rh, Pd, Ag, Os, Ir, Pt and Au, or a compound thereof.

3. The resistance change element according to claim 1, wherein the second metal oxide layer is any metal oxide selected from $HfO_x$, $ZrO_x$, $TiO_x$, and $SrTiO_x$.

* * * * *